United States Patent [19]

Yelland et al.

[11] Patent Number: 4,700,145

[45] Date of Patent: Oct. 13, 1987

[54] RADIALLY FED MICROWAVE SIGNAL COMBINER/DISTRIBUTOR APPARATUS

[75] Inventors: John Yelland; Alan Thompson, both of Isle of Wight, England

[73] Assignee: Plessey Overseas Limited, Ilford, England

[21] Appl. No.: 714,504

[22] Filed: Mar. 21, 1985

[30] Foreign Application Priority Data

Mar. 21, 1984 [GB] United Kingdom ................. 8407278

[51] Int. Cl.[4] .......................... H03H 7/48; H03F 3/60

[52] U.S. Cl. ...................................... 330/286; 330/56; 333/125; 333/127; 333/136

[58] Field of Search ............... 333/125, 127, 136, 137; 330/286, 56; 331/56, 107 DP

[56] References Cited

U.S. PATENT DOCUMENTS

| | | | |
|---|---|---|---|
| 3,576,579 | 4/1971 | Appelbaum et al. | 333/239 |
| 3,662,285 | 5/1972 | Rucker | 333/125 X |
| 3,938,247 | 5/1976 | Bogner et al. | 333/136 X |
| 3,942,130 | 3/1976 | Harp | 330/287 |
| 4,189,683 | 2/1980 | Fassett et al. | 330/56 X |
| 4,371,845 | 2/1983 | Pitzalis, Jr. | 333/127 X |

FOREIGN PATENT DOCUMENTS

| | | | |
|---|---|---|---|
| 1243741 | 7/1967 | Fed. Rep. of Germany | 333/137 |
| 0037703 | 3/1984 | Japan | 333/125 |

OTHER PUBLICATIONS

"Radial Combiner Runs Circles Around Hybrids," by Bobby J. Sanders, ITT Gilfillan, Microwaves, Nov. 1980, pp. 55–58.

*Primary Examiner*—Eugene R. LaRoche
*Assistant Examiner*—Benny T. Lee
*Attorney, Agent, or Firm*—Fleit, Jacobson, Cohn & Price

[57] ABSTRACT

Radially fed microwave signal combiner/distributor apparatus comprising a central coaxial connector which is coupled via radially extending paths to several circumferential coaxial connectors which are equiangularly disposed on the circumference of a circle surrounding the central connector, the apparatus including a generally discoidal microwave transmission cavity through which the paths extend, which cavity communicates at the center thereof with the central coaxial connector and which cavity communicates at the circumferential periphery thereof with the circumferential coaxial connectors via a conductive annulus, which annulus is spaced away from the internal circumferential periphery of the cavity, and to which annulus the inner conductors of the circumferential coaxial connectors are electrically connected at locations equiangularly spaced around the annulus.

4 Claims, 7 Drawing Figures

RADIALLY FED MICROWAVE SIGNAL COMBINER/DISTRIBUTOR APPARATUS

BACKGROUND

This invention relates to radially fed microwave signal combiner/distributor apparatus and more especially but not exclusively, it relates to such apparatus for use in microwave amplifier arrangements for radar systems or other microwave systems.

Known radially fed signal combiner/distributor apparatus comprises a central microwave signal connector which is coupled via radially extending paths to several equiangularly spaced, circumferentially disposed microwave signal connectors surrounding the central connector, whereby microwave energy can be fed either to the central connector for distribution to the circumferential connectors or alternatively it can be fed to the circumferential connectors and combined at the central connector.

In order to fabricate an amplifier arrangement for the high power amplification of microwave energy it is known to use two such signal combiner/distributors, as described in an article by Mr B J Sanders entitled "Radial Combiner Runs Circles Around Hybrids" in 'Microwaves' November 1980, pp. 55–58 the respective circumferential connectors of which are mutually coupled by a number of individual low power amplifiers so that the central connector of one of the two signal combiner/distributor serves as an input connector via which signals are fed radially to the amplifiers, and so that the central connector of the other of the two signal combiner/distributors serves as a high power output terminal fed radially from the amplifiers.

This known amplifier arrangement thus uses a number of low power amplifiers to provide for high power amplification and such an arrangement may therefore be used to replace a travelling wave tube or a klystron transmitter.

In known signal combiner/distributor arrangements, the circumferential connectors are each connected to a balun loop coupler which serves to facilitate the transmission or reception of microwave energy radially. Thus, in signal combiner/distributor apparatus for use in microwave amplifiers which comprise a great many circumferential connectors, a correspondingly large number of balun loop couplers are required which are costly to manufacture and time consuming to assemble.

Moreover, in the known apparatus, in order to suppress higher order modes which arise from within the structure and/or from variations in termination impedances, resistors are connected within the apparatus between the balun loops, and if a resistor should fail the apparatus must be dismantled in order to replace it.

It is an object of the present invention to provide radially fed signal combiner/distributor apparatus which is relatively inexpensive to produce, simple to construct and reliable in operation.

SUMMARY OF THE INVENTION

According to the present invention, radially fed microwave signal combiner/distributor apparatus comprises a central coaxial connector which is coupled via radially extending paths to several circumferential coaxial connectors which are equiangularly disposed on the circumference of a circle surrounding the central connector, the apparatus including a generally discoidal microwave transmission cavity through which the paths extend, which cavity communicates at the centre thereof with the central coaxial connector and which cavity communicates at the circumferential periphery thereof with the circumferential coaxial connectors via a conductive annulus, which annulus is spaced away from the internal circumferential periphery of the cavity, and to which annulus the inner conductors of the circumferential coaxial connectors are electrically connected at locations equiangularly spaced around the annulus.

By providing a conductive annulus for the transmission or reception of microwave energy radially instead of a plurality of balun loops as used in known systems, the construction is substantially simplified with obvious advantages including the advantage that reliability is improved since internal resistors are not required.

The cavity may be defined between conductive walls which are stepped whereby the axial depth of the cavity is increased progressively from its circumferential periphery to its centre.

At least one step in one of the walls may be tapered.

The annulus may comprise an annular flange having a circular peripheral edge to which the inner conductors are connected.

The inner conductors may be received within grooves or slots in the circular peripheral edge.

The flange may be configured to taper toward the internal circumferential periphery of the cavity so as to define between one wall of the cavity and one face of the flange an annular space of generally wedge like cross section.

The cavity may at the centre thereof be arranged to turn through 90° and one wall of the cavity may be angled to define a cone which serves to facilitate microwave transmission around the turn.

The cavity may be filled with a dielectric material and the walls of the cavity may be defined by a metal coating on the dielectric material.

In order to provide a microwave power amplifier arrangement, two similar signal combiner/distributors may be stacked axially, adjacent pairs of circumferential connectors comprising one from each of the two signal combiner/distributors being arranged to be coupled by microwave amplifiers such that in use, the microwave amplifiers are fed via the circumferential connectors of one signal combiner/distributor from the central connector of the said one signal combiner/distributor and such that the amplifiers are arranged to feed the circumferential connectors of the other signal combiner/distributor thereby to provide an output signal at the central conductor of the said other signal combiner/distributor.

BRIEF DESCRIPTION OF THE DRAWINGS

Some embodiments of the invention will now be described solely by way of example with reference to the accompanying drawings in which.

DETAILED DESCRIPTION

Figure 1A:
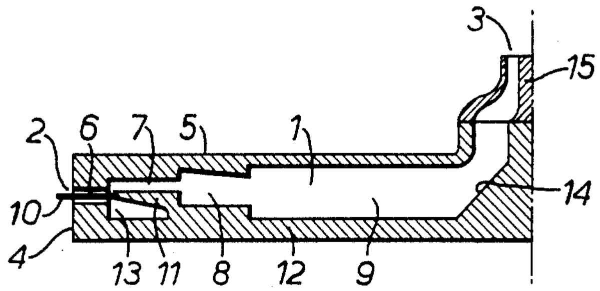
FIG. 1*a* is a somewhat schematic part sectional view of a microwave signal combiner/distributor.

Referring now to FIG. 1*a,* a microwave signal combiner/distributor comprises a generally discoidal transmission cavity 1, a part of which only is shown in section in FIG. 1*a*, which serves for the transmission of microwave energy along radial paths between a circumferential coaxial connector 2 and a central coaxial connector 3. As will hereinafter be explained in detail, the microwave signal combiner/distributor comprises a plurality of circumferential coaxial connectors such as the circumferential connector 2, which are disposed equiangularly around the circumferential periphery 4 of a discoidal body structure 5 in which the cavity 1 is defined.

The microwave signal combiner/distributor is in effect a two way transmission device and accordingly, microwave energy may either be fed to the central coaxial connector 3 and distributed between a plurality of circumferential connectors such as the connector 2, or alternatively signals fed to the circumferential connectors may be combined at the central connector 3. Thus, it will be appreciated that the signal combiner/distributor may either operate as a microwave signal combiner or as a microwave signal distributor.

Figure 1B:
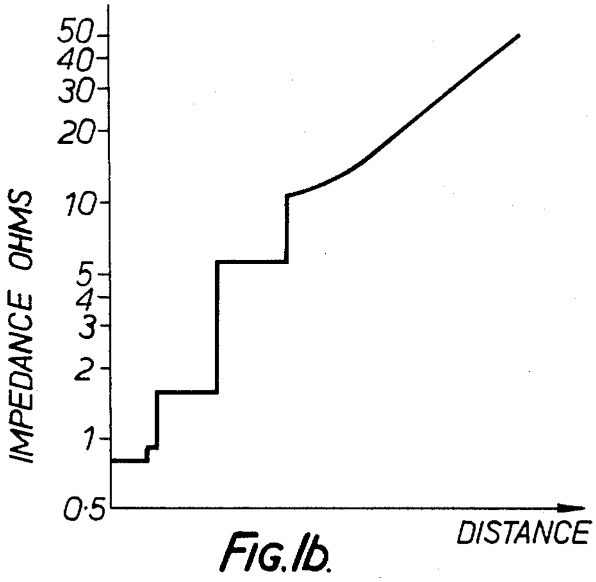
FIG. 1*b* is a graph of impedance in ohms plotted against distance and it shows the impedance change with distance from the circumferential periphery of the signal combiner/distributor shown in FIG. 1 to its centre.

As shown in FIG. 1*b,* the impedance is progressively transformed from about 0.75 ohms at the circumferential coaxial connector 2 to approximately 50 ohms at the central connector 3. This impedance transformation is achieved by means of a four section transformer comprising sections 6, 7, 8 and 9 as shown in FIG. 1*a*. The first section 6 comprises a series inductance associated with a connecting pin 10 of the circumferential coaxial connector 2. The second section includes a generally wedge shaped launching ramp 11 which is spaced apart from the circumferential periphery 4 and from a lower wall 12 of the body structure 5 by a wedge shaped annular cavity 13. The second section 7 opens via a step into the third section 8 which is of greater axial depth and which is arranged to taper towards the fourth section 9.

In the fourth section 9, the impedance varies in a hyperbolic manner through to the central coaxial connector 3. The fourth section 9 includes a conical surface 14 which facilitates the transition between propagation of the microwave energy and a coaxial propagation mode associated with the central connector 3, the conical surface 14 being arranged to extend so as to communicate with an inner conductor 15 of the central coaxial connector 3.

Figure 2:
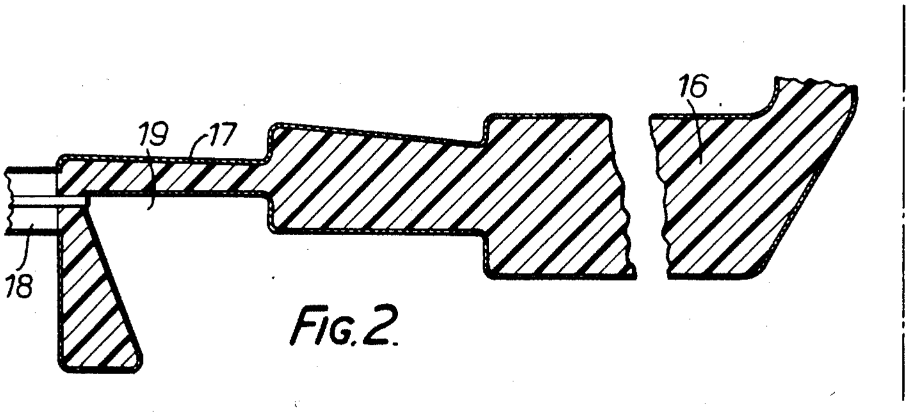
FIG. 2 is a somewhat schematic sectional view of a microwave signal combiner/distributor using a dielectric radial transmission cavity.
Figure 3:
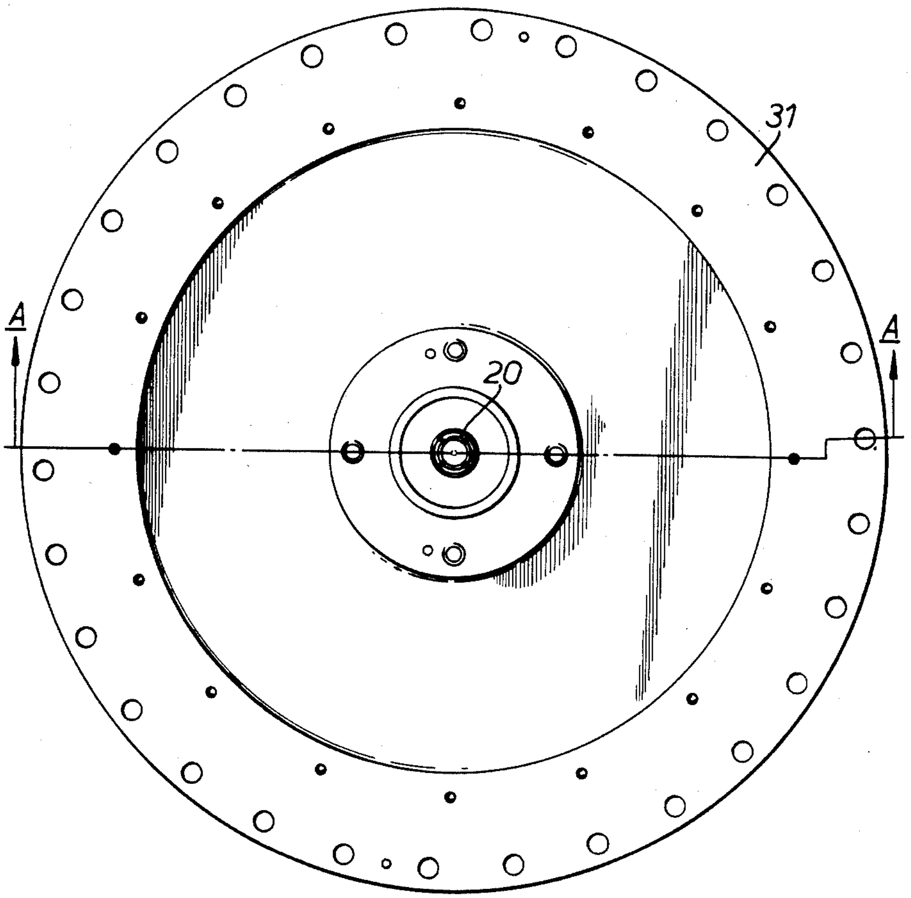
FIG. 3 is a plan view of a pair of microwave signal combiner/distributors suitable for use in a microwave amplifier arrangement.
Figure 4:
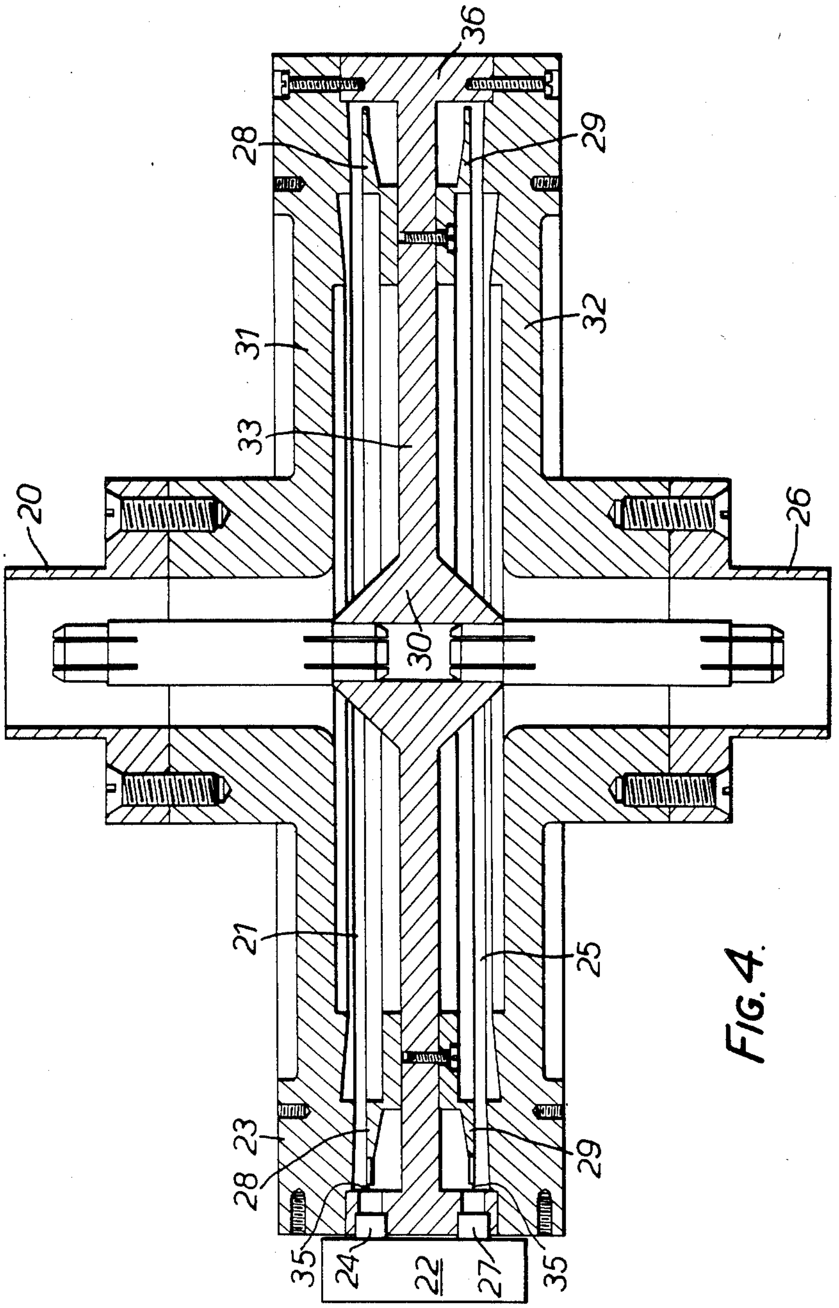
FIG. 4 is a sectional view along a line A—A of the microwave signal combiner/distributors shown in FIG. 3.
Figure 5:
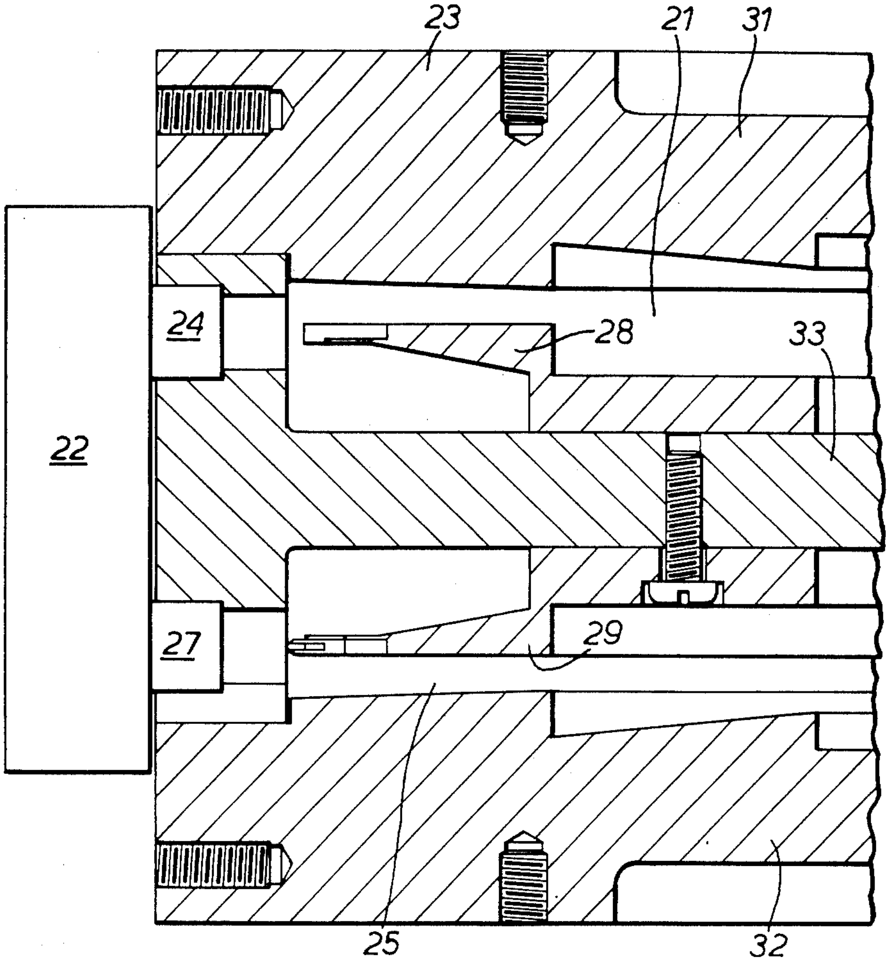
FIG. 5 is an enlarged sectional view of a part of the signal combiner/distributors shown in FIG. 4.

The generally discoidal microwave cavity 1 shown in FIG. 1 comprises an air space, but in an alternative arrangement, the microwave cavity may be filled with dielectric material 16 as shown in FIG. 2 and surrounded by a conductive wall 17 defined by a conductive metallic coating formed to define a cavity which corresponds to the cavity of FIG. 1.

The arrangement of the microwave signal combiner/distributor shown in FIG. 2 is similar to FIG. 1, the microwave cavity defined by the dielectric material 16 being fed from a coaxial connector 18 via a launching section 19 so that microwaves are propagated through the cavity 16 between a number of circumferentially disposed coaxial connectors, such as the connector 18 and a central coaxial connector (not shown) which corresponds to the central coaxial connector 3 of FIG. 1*a*.

Although a single radially fed microwave signal combiner/distributor may be used either to combine microwave signals or to distribute a microwave signal to a number of outlet connectors, it is especially contemplated that two radially fed microwave signal combiner/distributors may be axially combined and linked by a plurality of microwave amplifiers to produce a microwave amplifier arrangement which is especially suitable for use in radar systems or other microwave systems.

One such microwave amplifier arrangement will now be described with reference to FIGS. 3, 4, 5 and 6.

Referring now to these Figures, wherein corresponding parts bear the same numerical designations, a microwave amplifier arrangement comprises a central coaxial input connector 20 which communicates via a generally discoidal microwave transmission cavity 21 of a first combiner/distributor with a plurality of microwave amplifiers, only one of which amplifiers referenced 22 is shown in the drawings. The microwave amplifiers such as the amplifier 22 are equiangularly arranged in spaced apart relationship around the periphery of a generally discoidal housing 23 in which the cavity 21 is defined (see, for example, FIG. 4), the amplifiers being fed from a plurality of coaxial connectors which include the connector 24 and which form a part of a first combiner/distributor. Amplified signals provided by the amplifiers, including an amplifier 22, are fed to a second microwave signal combiner/distributor including a radial transmission cavity 25 which is arranged in communication with a central coaxial output connector 26. Thus, in the case of the amplifier 22, output signals are fed therefrom via a circumferential coaxial connector 27 which feeds the microwave cavity 25 radially.

In order to facilitate collection of radially distributed microwave signals, the cavity 21 includes a flanged annulus 28 via which microwave signals are fed to circumferential coaxial connectors such as the connector 24. Similarly, output signals from the amplifier 22 are fed to a similar flanged annulus 29 which is positioned within the cavity 25 and which receives output signals from amplifiers including the amplifier 22. A cone shaped structure 30 is provided, the upper part of which serves to divert signals from the central coaxial inlet connector 20 so that they radiate radially and the lower part of which serves to direct radial signnals transmitted from amplifiers, such as the amplifier 22, to the coaxial output connector 26.

Figure 6:
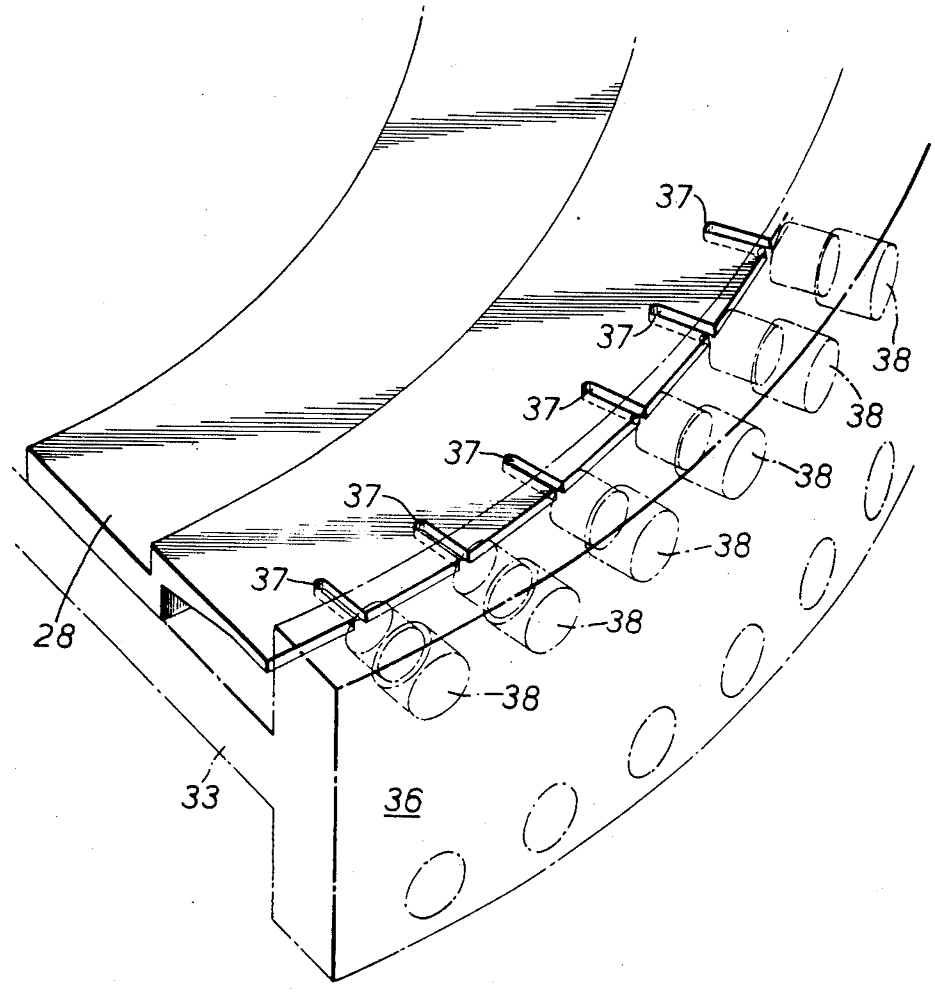
FIG. 6 is a perspective view of a part of the signal combiner/distributors shown in FIGS. 3, 4 and 5.

The cavities 21 and 25 of the first and second combiner/distributors respectively are defined between inner and outer casings 31 and 32 between which a diaphragm member 33 is sandwiched which embodies the conical structure 30. The diaphragm member 33 is arranged to support on opposing sides the flanged annuli 28 and 29 which serve for signal distribution and signal launching respectively. The flanged annulus 28 and the flanged annulus 29 are similar. FIG. 6 shows in detail the construction of the flanged annulus 28 which embodies a plurality of grooves 37 which are equiangularly formed around its circular periphery and arranged to receive inner conductors 35 (FIG. 4), of circumferential connectors such as the connectors 24 and 27, in holes or recesses 38 provided for the purpose in the circumferential periphery 36 of the diaphragm member 33.

By providing a microwave amplifier arrangement comprising a pair of axially disposed radially fed microwave signal combiner/distributors as shown in FIGS. 3, 4, 5 and 6, which includes the flanged annuli 28 and 29, the provision of a particularly effective and reliable amplifier arrangement is facilitated.

We claim:

1. A radially fed microwave signal combiner/distributor, comprising a central coaxial connector which is coupled to several circumferential coaxial connectors which are equiangularly disposed in a circle-shaped configuration surrounding the central connector, the apparatus including a generally discoidal microwave transmission cavity which communicates at the centre thereof with the central coaxial connector and which cavity communicates at the circumferential periphery thereof with the circumferential coaxial connectors via a conductive annulus, the microwave transmission cavity being defined on one side of the annulus by conductive walls which are stepped whereby the axial depth of the microwave transmission cavity is increased progressively from its circumferential periphery to its centre, and the annulus being formed to define on a side thereof remote the microwave transmission cavity a further annular cavity thereby to define a launching flange configured to taper towards the circumferential periphery of the microwave transmission cavity so as to define the annular cavity, between one wall defining the microwave transmission cavity and one face of the flange, as an annular space of generally wedge like cross-section, to which the inner conductors of the circumferential coaxial connectors are electrically connected at locations equiangularly spaced around the annulus.

2. A radially fed microwave signal combiner/distributor, as claimed in claim 1 wherein the inner conductors are received within grooves, slots or holes in the circumferential periphery.

3. A radially fed microwave signal combiner/distributor, as claimed in claim 1, wherein the cavity is filled with a dielectric material and the walls of the cavity are defined by a metal coating on the dielectric material.

4. A microwave power amplifier arrangement comprising a pair of radially fed microwave signal combiner/distributors, each combiner/distributors comprising a central coaxial connector which is coupled to several circumferential coaxial connectors which are equiangularly disposed in a circle-shaped configuration surrounding the central connector, the apparatus including a generally discoidal microwave transmission cavity which communicates at the centre thereof with the central coaxial connector and which cavity communicates at the circumferential periphery thereof with the circumferential coaxial connectors via a conductive annulus, the microwave transmission cavity being defined on one side of the annulus by conductive walls which are stepped, whereby the axial depth of the microwave transmission cavity is increased progressively from its circumferential periphery to its centre, and the annulus being formed to define on a side thereof remote the microwave transmission cavity a further annular cavity thereby to define a launching flange configured to taper towards the circumferential periphery of the microwave transmission cavity so as to define the annular cavity, between one wall defining the microwave transmission cavity and one face of the flange, as an annular space of generally wedge like cross-section, to which the inner conductors of the circumferential coaxial connectors are electrically connected at locations equiangularly spaced around the annulus, said pair of signal combiner/distributors being stacked axially, adjacent pairs of circumferential connectors, comprising one from each of the two signal combiner/distributors being arranged to be coupled to respective microwave amplifiers such that in use, the microwave amplifiers are fed with an input signal, via the circumferential connectors of one of the two signal combiner/distributors, from the central connector thereof and such that the amplifiers are arranged to feed the circumferential connectors of the other of the two signal combiner/distributors thereby to provide an output signal at the central conductor of the said other combiner/distributor.

* * * * *